United States Patent
Siegel et al.

(10) Patent No.: US 6,759,326 B2
(45) Date of Patent: Jul. 6, 2004

(54) METHOD OF MAKING A SEMICONDUCTOR DEVICE HAVING A PLANARIZED FLUOROPOLYMER PASSIVATING LAYER WITH SELECTIVELY IMPLANTED CHARGED PARTICLES

(75) Inventors: Harry M. Siegel, Hurst, TX (US); Fred P. Lane, Highland Village, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/637,414

(22) Filed: Aug. 8, 2003

(65) Prior Publication Data

US 2004/0038515 A1 Feb. 26, 2004

Related U.S. Application Data (62) Division of application No. 10/010,996, filed on Nov. 30, 2001.

(51) Int. Cl.$^7$ ........................................... H01L 21/4763
(52) U.S. Cl. ...................... 438/642; 438/618; 438/622; 438/763; 438/780; 438/783
(58) Field of Search ............................... 438/618, 622, 438/642, 763, 780, 783, FOR 395

(56) References Cited

U.S. PATENT DOCUMENTS

| | | | | |
|---|---|---|---|---|
| 4,358,677 A | * | 11/1982 | Ruell et al. | 250/216 |
| 6,060,383 A | * | 5/2000 | Nogami et al. | 438/622 |
| 6,432,844 B1 | * | 8/2002 | Farrar | 438/783 |
| 6,483,193 B2 | * | 11/2002 | Usami | 257/758 |
| 6,537,904 B1 | * | 3/2003 | Ishizuka | 438/623 |
| 2002/0164868 A1 | * | 11/2002 | Chang et al. | 438/622 |

* cited by examiner

*Primary Examiner*—George Fourson
*Assistant Examiner*—Michelle Estrada
(74) *Attorney, Agent, or Firm*—Lisa K. Jorgenson; Peter J. Thoma (57) ABSTRACT

A touch-sensitive semiconductor chip having a physical interface to the environment, where the surface of the physical interface is coated with a fluorocarbon polymer. The polymer is highly scratch resistant and has a characteristic low dielectric constant for providing a low attenuation to electric fields. The polymer can be used instead of conventional passivation layers, thereby allowing a thin, low dielectric constant layer between the object touching the physical interface, and the capacitive sensing circuits underlying the polymer.

4 Claims, 4 Drawing Sheets

METHOD OF MAKING A SEMICONDUCTOR DEVICE HAVING A PLANARIZED FLUOROPOLYMER PASSIVATING LAYER WITH SELECTIVELY IMPLANTED CHARGED PARTICLES

CROSS-REFERENCE TO RELATED APPLICATIONS

This U.S. patent application is a division of U.S. application Ser. No. 10/010,996, filed Nov. 30, 2001.

TECHNICAL FIELD OF THE INVENTION

The present invention relates in general to semiconductor devices and processing methods, and more particularly to the use of an organic polymer protective coating on semiconductor chips having surfaces exposed to the environment.

BACKGROUND OF THE INVENTION

Integrated circuits are employed in many different environments which require protection against mechanical damage, chemical deterioration, electromagnetic and electrostatic invasion, and a host of other agents. Conventional integrated circuits are fabricated on wafers, each of which consists primarily of a monocrystalline silicon substrate. Upon completion of the fabrication process, the wafer is sliced into separate square or rectangular chips, each including a complete integrated circuit, which is then encapsulated to form a finished device.

The manner in which an integrated circuit is fabricated and packaged determines in a large part how well the chip is protected from the foregoing environmental effects. The outer package of an integrated chip is intended to provide mechanical protection, and to a certain degree moisture protection. The integrated chip itself is fabricated with various passivation layers to provide intimate protection from numerous environmental attacks, including ion diffusion (sodium ions especially) into the active circuitry of the semiconductor chip. An industry standard for passivation of a semiconductor chip is to deposit an inorganic silicon nitride material over the surface of the chip. This passivation material provides an excellent barrier and protects the active circuitry from the adverse effects of moisture, sodium and other similar ions.

Integrated circuits have traditionally been packaged with a plastic, ceramic or other type of encapsulating material to provide mechanical and moisture protection to the chip. The pins or contact pads of the packaged chip are accessible to provide electrical access to the circuits of the chip. This is a common packaging technique, as the only access required to the chip is by way of electrical signals.

A new generation of integrated circuit chips has evolved where a mechanical or physical input to the chip is necessary. One such type of integrated circuit is used in the biometric field where a physical input, such as a finger touch to the chip, is used so that corresponding signals can be processed by the chip to produce an output related to the touch. In one family of integrated chips, a surface or physical interface of the chip is not encased or encapsulated in the conventional manner, but rather is accessible for touching by a fingertip so the image of a fingerprint can be electrically generated by the circuits of the chip. An array of sensing capacitors is fabricated near the exposed surface of the chip to sense the ridges and valleys of the fingerprint. Such type of integrated circuit is disclosed in U.S. Pat. No. 6,114,862 by Tartagni, et. al., assigned to the assignee hereof. Other sensing techniques are available in integrated circuits for reproducing a person's fingerprint when the integrated circuit is touched.

When a physical interface is necessary between the integrated circuit chip and the environment, special precautions must be taken, as the use of conventional encapsulation is often not an option. The physical interface must not interfere with the interaction between the environment and the chip, whether it be the texture of an object such as a fingerprint, the temperature of the article physically contacting the chip interface, optical inputs, etc. When an integrated circuit chip is provided with a physical interface exposed to the environment, there is always a concern that such an interface is sufficiently rugged, but yet also sufficiently protective to the underlying circuits. Conventionally, the physical interface to biometric fingerprint sensors involves the use of a very thin silicon carbide layer covering a silicon nitride passivation layer. Silicon carbide is well known for its durability, in that it is an extremely hard material. When used with capacitor-type fingerprint sensors, the thickness of the passivation layer and the physical protective layer should be relatively thin so as not to compromise the sensitivity of the sensing circuits to the differences in the physical properties that exist between the ridges (flesh) and valleys (air gaps) of the fingerprint. It has been found that when a thin silicon carbide layer is used for the physical interface, it is very durable and highly wear resistant, but can nevertheless crack or break when subjected to concentrated loads. Although the silicon carbide material provides an extremely hard physical interface, the brittle characteristic of such material is a disadvantage, especially when it is subjected to impact forces produced by sharp or pointed objects.

Figure 1:
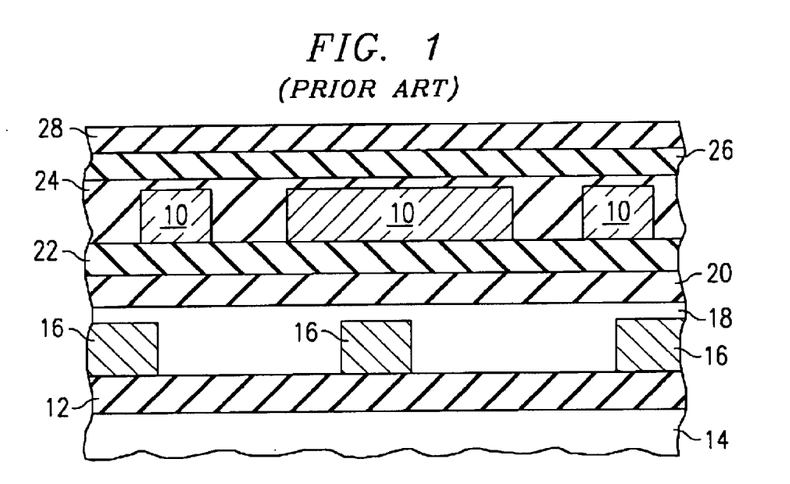
FIG. 1 is a cross-sectional view of a touch-sensitive semiconductor chip illustrating the conventional layers of passivation.

FIG. 1 illustrates the material layers of a conventional semiconductor chip of the type that has a physical interface to the environment. In this type of integrated circuit, a metal layer 10 forming a network is deposited on an intermediate layer, and patterned, so as to form a matrix of fringing capacitors to sense the ridges and valleys of a fingerprint. The principle of operation of such type of integrated circuit is set forth in more detail in U.S. Pat. No. 6,114,862, noted above. The basic structure includes two side-by-side capacitor plates at each sensor cell or pixel of an array of such pixels. The skin surface of the user's finger, when pressed against the sensing surface or physical interface, forms a common capacitor plate with the side-by-side plates at each pixel and effectively modulates the fringing capacitance between the plates. The change in the fringing capacitance is sensed to determine the presence of a fingerprint ridge or valley at the particular pixel location. A plurality of pixels arranged in a matrix thus provide a complete image of the fingerprint.

In the construction of a fringing capacitor, touch-sensitive chip, a dielectric layer 12 is deposited over the silicon wafer or substrate 14. An interconnect metal 16 is deposited over the dielectric layer 12 and patterned to provide interconnections between circuits formed in the silicon material of the substrate 14. At this point, the device structure is planarized by depositing a material 18 over the patterned metal 16 and planarizing the material 18. One or more intermediate layers 20 and 22 may be formed over the planarized surface of the device. The metal network 10 forming the plates of the fringing capacitors is formed on the intermediate layers 20 and 22, and again planarized using a material 24, such as a conventional FOX spin-on glass, or other suitable material.

In order to provide a mechanical and chemical protective coating over the surface of the touch-sensitive portion of the chip, it is a conventional practice to form one or more passivation layers of a hard and chemically resistant material, such as silicon nitride 26 and/or silicon carbide 28. In many instances, even when a silicon carbide passivation layer is employed, an underlying silicon nitride layer is also used, as it is well accepted in the industry for its excellent passivation properties. In other words, when the passivation of a new chip constitutes at least some silicon nitride, the chips are more readily accepted and qualified according to conventional semiconductor processing standards. Semiconductor industry standards recognize that silicon nitride is excellent in providing a barrier to ionic diffusion and moisture ingestion. While these passivation materials are well suited for standard semiconductor chips, such materials have many of the shortcomings noted above.

The selection of a passivation material for a semiconductor chip that requires an environmental interface is important, insofar as the dielectric constant is concerned. This is especially the case when touch-sensitive chips are concerned. In this type of chip, perturbations in the capacitive electric field are sensed to determine the contour of the object touching the physical interface of the chip. The electric field between the object touching the chip and the underlaying fringing capacitor network is a function of the dielectric constant of the material layers therebetween. As a result, it has been found that passivation layers are better suited for touch-sensitive chips, when such layer(s) have a relatively low dielectric constant. It is well known that the inorganic silicon-based passivation materials, such as silicon nitride, have a relatively high dielectric constant in the range of about 8–9. Silicon carbide has a dielectric constant of about 9.7. Other dielectric materials, such as the organic family of the polyimide materials, have a relative high dielectric constant in the range of about 3–8.

An important consideration in the design of a physical interface for touch-sensitive chips, is that of "ghosting". The properties of the material selected for the physical interface may exacerbate ghosting, where the oils and/or water of previous finger prints remain after the finger is removed. These residues can produce a latent image to the chip even when there is no finger present. This creates problems with security equipment and may interfere with the correct recognition of a current finger print image.

In selecting the type of material for use as a passivation layer for touch-sensitive chips, the thickness of the passivation layer(s) is also a consideration. While thick layers provide a better barrier to chemical invasion and mechanical shock, the sensitivity of the capacitive reaction between the object and the fringing capacitive network is reduced when the passivation layer is thicker. Hence, for optimum performance of a touch-sensitive, fringing capacitive chip, the passivation layer should be highly rugged and resistant to impact shock and scratches, provide a barrier to chemical invasion, be hydrophobic and oleophobic, have a relatively low dielectric constant, and be able to be deposited on the chip surface as a thin layer.

An organic fluoropolymer has recently been developed for use with semiconductor chips. The polymer is disclosed in U.S. Pat. Nos. 4,977,297 and 4,982,056 by Squire, and issued to E. I. du Pont de Nemours and Company ("DuPont"). This material has a low dielectric constant of about 2.1, making it well adapted for use with electrical and electronic applications, such as between circuit layers in multi-layer circuit boards. In the Squire patents, the polymer is also indicated as being useful for coating and encapsulating electronic circuits using a solution coating process.

A Teflon® amorphous fluoropolymer (Teflon AF) is available for use with semiconductor circuits. The Teflon AF has a dielectric constant of 1.89–1.93, and thus makes it a good candidate for use as passivation layers and for encapsulation of hybrid/sandwich integrated circuit packaging. The Teflon AF material can be applied in thin coatings, to the micron level. Teflon® is DuPont's registered trademark for fluorinated ethylene propylene, and is used in connection with a variety of low-friction, highly durable products.

It can be seen from the foregoing that a need exists for a physical interface on integrated circuits, where the physical interface is rugged, durable and less susceptible to breakage when subjected to point contact loading, and the like. Another need exists for a single thin physical layer on intergrated circuits that can replace the traditional silicon nitride and silicon carbide layers, thereby increasing the sensitivity of the sensing circuits. Yet another need exists for an organic passivation layer that is rugged but somewhat compliant, thereby reducing the tendency of the physical interface to break or crack. A need exists for a physical interface to an integrated chip, where the physical interface reduces latency effects and hypersensitivity to moisture, oils, etc.

SUMMARY OF THE INVENTION

The present invention disclosed and claimed herein, in one aspect thereof, comprises a method of passivating an integrated circuit of the type having a physical interface to the environment. In accordance with the principles and concepts of the invention, the method includes the step of depositing a fluorocarbon polymer as an outer layer of the physical interface. This type of physical interface can be applied to the integrated chip as a thin layer that is tough, compliant, and exhibits a low coefficient of friction so that it is resistant to abrasion, scratches and other forms of mechanical damage. The low dielectric constant characteristics of the fluorocarbon polymer make it well adapted for use in fringing capacitive type biometric sensors.

When a fluorocarbon polymer is used as the physical interface to a touch-sensitive chip, the latency of the residual image (once the finger is removed) is substantially reduced.

In another form of the invention, the fluorocarbon polymer can be deposited on the outer surface of the integrated circuit as a passivation layer, in lieu of the conventional silicon nitride and silicon carbide passivation layers. For ease of operation, the fluorocarbon polymer can be applied by spray techniques over the active circuits of the semiconductor device, in the window area of the encapsulation to provide the physical interface to the environment.

In another aspect of the invention, the conventional planarizing and overlying passivation layers of an integrated circuit can be replaced with an organic layer of fluorocarbon polymer which can be planarized, and which also functions as a passivation layer for the chip. In addition, a gettering agent can be implanted in the fluorocarbon polymer material to immobilize deleterious ions, such sodium ions.

In yet another aspect of the invention, particles can be implanted into the surface of the fluorocarbon polymer to produce variations in the electrostatic field generated by the fringing capacitors of a touch-sensitive integrated circuit. Based on the type of particles, the concentration, and the location thereof, such particles can influence the shape and intensity of the electric field in a desired manner.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, elements or functions throughout the views, and in which.

DETAILED DESCRIPTION OF THE INVENTION

The preferred and other embodiments of the invention are described below. However, it is to be understood that the principles and concepts of the invention can be used in many other applications, and are not limited to touch-sensitive devices where a physical stimulus such as a finger touch, is input thereto. While the features of the invention are described in connection with a touch-sensitive integrated circuit, such features can be employed with many other integrated circuits, including chips where the physical input to the chip includes a sliding or wiping touch to the physical interface. In the latter type of touch-sensitive chip, the underlying circuits employ a scanning technique to rasterize the image of the object moved across the physical interface. In the description that ensues, the drawings do not illustrate the devices to scale, especially the thickness of the various material layers.

Figure 2:
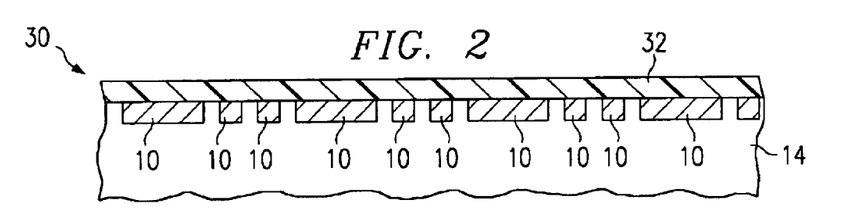
FIG. 2 is a cross-sectional view of a portion of a touch-sensitive semiconductor wafer showing the use of an organic polymer for the physical interface of the chip.

With reference to FIG. 2, there is shown an embodiment of the invention where the physical interface 30 is exposed to the environment so that a physical stimulus can be input to the chip. As noted above, when this situation is encountered, the physical interface 30 must be resistant to chemicals and be durable so as not to be damaged by objects scratching or striking the surface of the physical interface 30. In the formation of an integrated circuit on a substrate 14 providing a physical interface 30, it is realized that the other portions of the device may be encapsulated with a plastic, ceramic, or other suitable encapsulation material.

It has been found that an ideal material with which the physical interface can be formed is a fluorocarbon polymer 32. One polymer 32 that is believed to be well adapted for use in connection with the invention, and as described below, is informally identified as Teflon® AF amorphous fluoropolymers, as described in detail in U.S. Pat. Nos. 4,977,297 and 4,982,056, both by Squire. The disclosures of such patents are incorporated herein by reference. This type of polymer lends itself well to use in semiconductor fabrication processes, especially as a spin-on material, is mechanically durable and is resistant to many chemicals.

Figure 3:
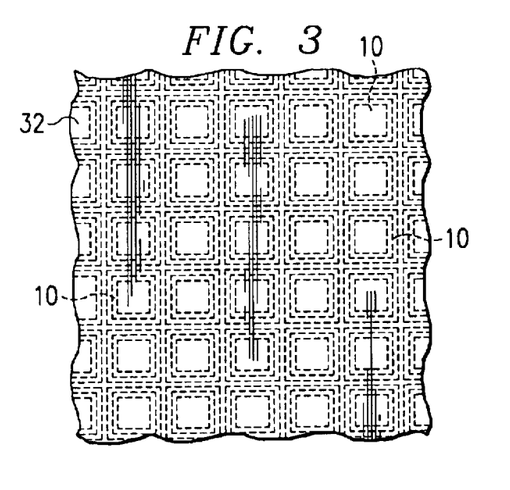
FIG. 3 is a top view of a portion of the chip shown in FIG. 2.

The touch-sensitive integrated circuit of FIG. 2 has a physical interface 30 with a fluorocarbon polymer 32 providing the thin film as a protective cover thereto. The polymer film 32 provides environmental protection to the underlying metal pattern 10 forming the fringing capacitors. Each fringing capacitor defines a pixel which produces an electric field that is affected by the dielectric properties of the object touching the physical interface. The dielectric constant of human flesh is in the range of about 30 to 80, and the dielectric constant of air is unity. The circuits of the sensor chip differentiate the difference in the dielectric constants of the fingerprint, which is the ridge flesh, and the fingerprint gap, which is air. The sensing circuits connected to the capacitor metal pattern 10 which detect changes in the electric field can be of the type disclosed in U.S. Pat. No. 6,114,862 by Tartagni et al. It is understood that many fringing capacitors and corresponding metal patterns are formed near the surface of the semiconductor chip, such as shown in FIG. 3.

Figure 4:
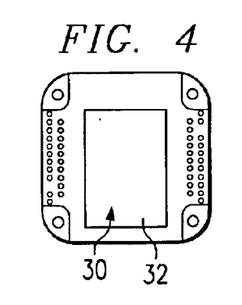
FIG. 4 is a top view of an embodiment of a touch-sensitive integrated circuit with a physical interface.

In practice, in the touch-sensitive integrated circuit shown in FIG. 4, the area of the physical interface 30 may be about 12.8 mm by 18.0 mm (0.504 inch by 0.708 inch). With this arrangement, the physical interface 30 is sufficiently large to accommodate the touching thereof by a fingertip. The ridges and valleys of the fingerprint are sensed by the matrix of fringing capacitors so that the fingerprint can be characterized in digital form as an image, and easily compared by a processing system with a reference print(s). To that end, the thin film polymer 32 has a low dielectric constant of about 2.0, or less, thus enabling the fingerprint to be electrically coupled to the sensing capacitors with a low attenuation. The polymer film 32 is compliant, and not brittle like silicon carbide and silicon nitride, thereby providing a mechanically durable material that resists scratching, cracking or breaking when sharp or pointed objects are caused to contact or strike the polymer film 32. The compliant nature of the polymer film 32 allows surface loads, such as those caused by particles of objects, to be redistributed over a larger area, thus reducing the stress intensity on the underlying circuit structure.

The fluorocarbon polymer film 32 can be of different types of polymers, and applied over the surface of the physical interface 30 by various means. For example, the fluorocarbon polymer 32 can be applied by standard semiconductor processing spin-on techniques, using mask materials and etchants recommended by DuPont. A polymer of the type Teflon® AF1601S available from DuPont, is well adapted as a spin-on material for depositing films as thin as one micron. A spin-on fluorocarbon polymer is preferably used when used in lieu of the standard silicon-based passivation layers. This particular polymer has a low dielectric constant in the range of about 1.89 to 1.93. In the present application, the polymer can be deposited by spin-on techniques to a thickness in the range between about 1 to 25 microns, and preferably between 1 and 8 microns. The thickness of the spin-on polymer also depends on whether the layer is utilized as a protective coating, or as a planarizing layer. Beyond a thickness of about 25 microns, the signal attenuation becomes significant. As is well known, the spin-on technique for depositing materials on semiconductor wafers is carried out in the "front end" of the fabrication process. The front end of a semiconductor processing facility is generally maintained in a clean room atmosphere which is highly controlled as to the temperature, the cleanliness in terms of particles per volume of room air, gaseous components, etc.

There may be situations or applications in which the depositing of a fluorocarbon polymer by spin-on techniques is not efficient or practical. It has been found that certain fluorocarbon polymers are well adapted as spray-on films. A polymer typically known as DuPont 954-100 can be deposited to various thicknesses on the order of a hundred microns, as a carefully controlled spray. This polymer is particularly applicable as it provides an excellent and clear image. Other Teflon S series polymers supplied by DuPont may also be used. The fluorocarbon polymer identified as type 958-203 exhibits a high gain, but may cause background noise. The spray-on polymer can be applied to the chip as the physical interface 30 and not to other areas of the chip by using standard spray coating techniques such as spray shields, masking tapes, and precision spray equipment. When using these techniques, an etchant for the fluoropolymer is not needed. When masking is employed, masking tape having an opening can be applied to the chip so that the polymer can be sprayed only on the area of the chip desired to be covered with the polymer. When the chip is ready for curing, the tape can be removed.

The spray-on polymer can be applied over the physical interface 30 at either the chip level or the wafer level. It is anticipated that thin spray-on films can be formed with thicknesses in the range of about 5 to several hundred microns, depending on the type of polymer used. It is contemplated that a thickness in the range of about 8 to about 25 microns would be desirable. Spray-on equipment adapted for use with the invention may include pressurized spray equipment, nozzles and a suitable enclosure for preventing airborne particles from contaminating the spray-on process. The selection of a nozzle to achieve a desired film thickness is well within the skill of those familiar with spray coating techniques. Typically, a conveyor of a conventional type can be utilized to move the chips or wafers through the spray-on station, to a curing station. The spray-on polymer is cured by subjecting the wet film to a dry air temperature for a suitable period of time. The time/temperature conditions for curing the wet film are preferably those specified by the manufacturer of the particular type of polymer used. In the event that the cured polymer film requires patterning, such material can be etched by conventional etchants.

The advantage of the spray-on technique is that such technique can be carried out in an atmosphere which is much less stringent than that required of many clean rooms. Indeed, a liquid fluorocarbon polymer can be sprayed on the physical interface 30 of the chip in conventional room environments. Another advantage of the spray-on polymer is that it is self planarizing and requires no additional processing to achieve a smooth outer surface. A smooth exterior surface of the physical interface 30 is required so that any peaks or valleys therein are not interpreted as features in the object touching the physical interface 30.

Post-fab clean room applications of the fluorocarbon polymer may also include the dispensing of a liquid droplet on the chip or wafer, dipping the chip in a pool of the liquid polymer, etc. Irrespective of the method of application, when the fluorocarbon polymer 32 is deposited directly over the fringing capacitor metal network, a thin dielectric is the only layer of material separating the object touching the chip from the fringing capacitors which sense the contour of the object. It is thus apparent that with a thin dielectric layer of the polymer 32 and with a low dielectric constant, a highly sensitive electrical interface is realized. In addition to the excellent electrical properties in the touch-sensitive chip application, the fluorocarbon polymer is chip, crack and scratch resistant and is highly resistant to many chemicals typically encountered in commercial and military uses.

In the event that those skilled in the art desire to maintain a passivation layer of silicon carbide and/or silicon nitride covering the chip, then such layer(s) can nevertheless be applied in a conventional manner on the chip in the area of the physical interface 30, and then the fluorocarbon polymer 32 deposited thereover. The advantages of the polymer are not compromised by depositing the film over the traditional passivation layer(s). However, when a combination of a passivation layer and the polymer layer 32 is employed, the composite thickness of the layers is increased, thus reducing the sensitivity of the device, especially when using fringing capacitor circuits. Preferably, the fluorocarbon polymer film 32 provides an excellent passivation layer itself, and thus when used without additional passivation layers, the overall material thickness between the fringing capacitor structure and the object touching the physical interface 30 is minimized. Optimal sensitivity is thus achieved by reducing the attenuation in the capacitive coupling between the object and the fringing capacitor structure. In addition, by eliminating the traditional passivation layer(s), material costs are reduced, as are labor costs.

In accordance with another feature of the invention, a fluorocarbon polymer can be employed to planarize various surfaces of the wafer during processing. It is believed that the polymers identified as DuPont AF 1106 and AF 2400 are well adapted as planarizing materials that can be used in accordance with standard semiconductor processing methods. Other organic fluorocarbon polymers may be equally suitable for use as planarizing materials. Rather than using the FOX material layer 24, as shown in FIG. 1, for planarizing the layer in which the fringing capacitor metal is formed, a polymer can be used in lieu thereof. Indeed, the standard FOX planarizing material can be replaced, as well as the standard passivation layer(s), with one fluorocarbon polymer layer.

Figure 5:
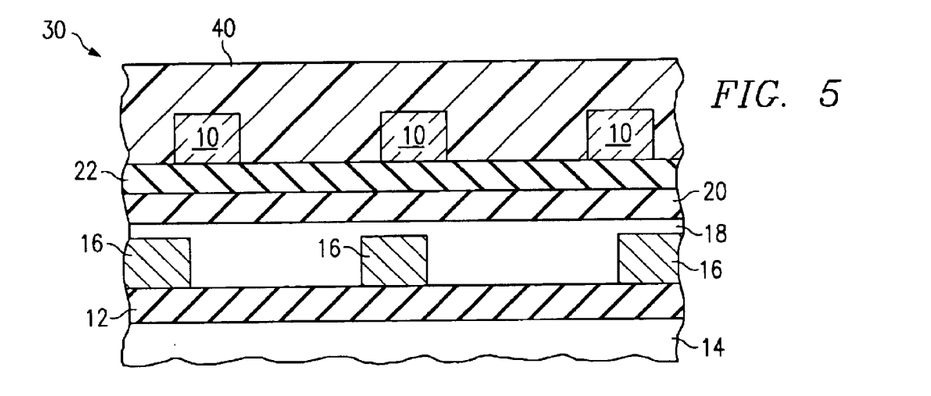
FIG. 5 illustrates a cross-sectional view of a touch-sensitive chip constructed in accordance with another embodiment of the invention, where standard planarizing and passivation material layers have been replaced by an organic polymer layer.

FIG. 5 illustrates in cross section a small portion of a semiconductor wafer where the standard material layers noted above have been replaced with a single a layer of an organic polymer 40. Here, the polymer layer 40 is deposited over the patterned metal layer 10 so as to planarize the surface and make it smooth and featureless. It is noted that a sufficient thickness of the polymer 40 is deposited so that an upper portion of the polymer functions as a passivation layer to the metal layer 10. It is anticipated that a total thickness of the polymer layer 40 may be in the range of about 7 microns. It is realized that the thickness of the polymer layer 40 is a function of the thickness of the metal layer 10. Metal layers typically functioning as fringing capacitors are about 2 microns thick. Preferably, the thickness of the polymer 40 located above the metal pattern 10 is about 5 microns.

As noted above, the organic fluorocarbon family of polymers are not only well adapted for semiconductor processes, but such polymers are self planarizing. This means that no other processes are necessary to achieve a planarized top surface. Whether the fluorocarbon polymer is spun or sprayed on the wafer surface, such material is initially in liquid form and thus sets with a smooth top surface. After a smooth surface is set into the organic material, the polymer is soft baked in the manner described above.

The structure shown in FIG. 5 lends itself well to an efficient and low cost physical interface 30 that is thin, mechanically durable, compliant, and resistant to chemicals. The small distance between the top surface of the polymer 40 and the underlying capacitor metal network 10 provides low attenuation for the coupling of the electric field between the object and the fringing capacitor. The low attenuation of the electric field and the low dielectric constant exhibited by the fluorocarbon polymer make an excellent combination of properties for a high sensitivity capacitor sensor.

Figure 6:
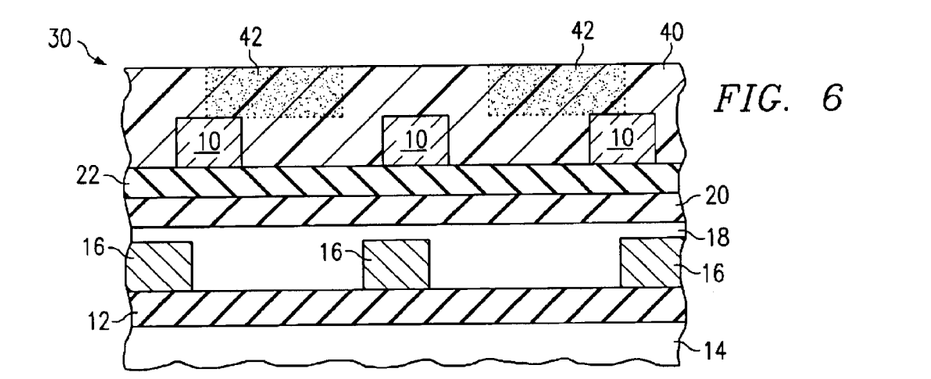
FIG. 6 is a cross-sectional view of the wafer of FIG. 5, but with a gettering agent disposed in the surface of the polymer physical interface.

With reference now to FIG. 6, there is shown the wafer of FIG. 5, but with a gettering agent 42 disposed in the surface of the polymer physical interface 40. Preferably, the gettering agent 42 can be electrons or other ions suitable for immobilizing or pinning deleterious ions. Phosphorus can be implanted to getter sodium ions. The getter electrons or ions can be implanted into the surface of the polymer 40 by conventional ion implant equipment. The depth to which the electrons or ions are disposed under the surface of the polymer 40 is a function of the energy with which the electrons or ions are driven into the polymer 40. Electron implantation into polymers for use as microphones is disclosed in the publication entitled "A Micromachined Thin-film Teflon Electret Microphone", by Hsieh et. al., presented at Nepcon West, February 1999, Anaheim Calif. The disclosure of this publication is incorporated herein by reference.

In the event that the gettering agent 42 is to be selectively implanted at desired locations in the polymer 40, then an implant mask, such as a physical block or photoresist material, can be used. The masking material can be deposited by conventional means on the surface of the wafer and patterned to open areas where the getter is to be implanted. In the masked areas of the wafer, the getter will not penetrate therethrough and thus will not be deposited in the underlying polymer 40.

In integrated circuits of the type which involve the use of electric fields, such as the fringing capacitor type employed with touch-sensitive chips, the selection of materials, the shape and configuration of the materials, and other parameters are important considerations. The principle of operation of the touch-sensitive chip is directly related to the nature of electric fields between the object and the sensor circuit which comprises the fringing capacitor network. As noted above, the type of dielectric, thickness thereof and other physical properties determine the nature of the electric field. In various types of sensors adapted to sense fingerprints, the dielectric differences between the ridges and valleys of the fingerprint produce corresponding variations in the electric fields, and thus influence the underlying fringing capacitor network. The strength or intensity of the electric field is sensed by the sensor capacitors and is converted to digital form for use in subsequent processing to reproduce the fingerprint pattern, or compare the same with one or more reference prints.

Figure 7:
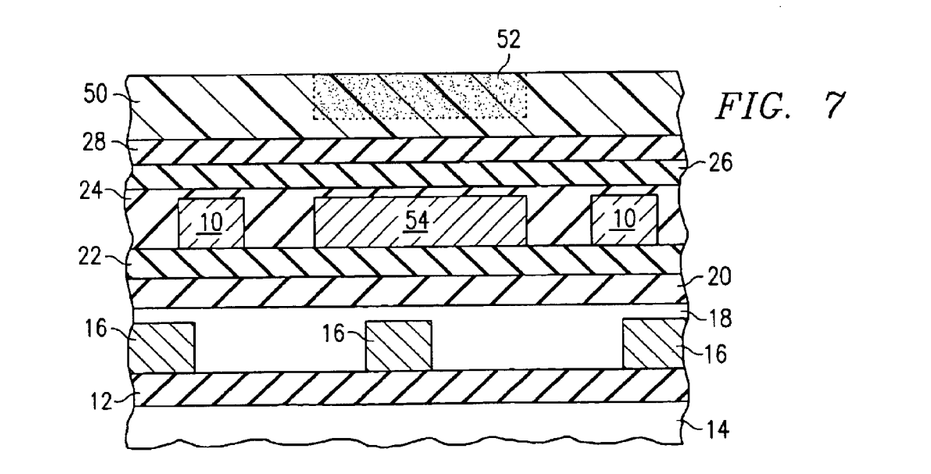
FIG. 7 illustrates a cross-sectional view of a portion of an integrated circuit provided with a polymer layer covering conventional passivation layers, where the polymer layer has embedded therein particles for influencing the electric field.

In accordance with another feature of the invention, the fluorocarbon polymer is well adapted for selective implant to modify or otherwise influence the characteristics of the electric field that exists between the object and the underlying circuit. FIG. 7 illustrates an embodiment of the invention where a fluorocarbon protective layer 50 has been deposited over the conventional silicon nitride layer 26 and silicon carbide layer 28. As noted above, this combination alone allows the two silicon-based layers 26 and 28 to be made thinner than in conventional practices. Implanted or otherwise deposited in the polymer layer 50 is an accumulation of particles 52, including electrons, ions or other matter that are capable of influencing an electric field. In the preferred embodiment, the particles 52 are implanted with an energy and dosage suitable to achieve a concentration that influences the electric field in the manner desired, it being realized that particles of various polarizations and concentrations will affect the electric field in different ways.

FIG. 7 also illustrates that the particles 52 are selectively deposited in the polymer 50 so that the concentration of the particles 52 varies from one location to another. Here, the concentration of the particles 52 is much higher in the location overlying the metal path 54, than in other regions in the polymer 50. The selective deposition of the particles, whether they be electrons, ions or other matter, can be achieved by forming a mask over the wafer, such as a photoresist type mask, and patterning the mask to open an area over the metal path 54. When the wafer is subjected to the implant operation, the particles will pass through the opening into the exposed polymer. In the other areas of the polymer that are covered with the mask material, the particles will not pass through the mask and thus the underlying polymer will not be implanted. Various other mask materials can be used for different types of particles and processes of deposition other than implant techniques. Indeed, various masking steps may be carried out in a sequence such that some areas can be implanted at different depths as compared to other areas, and/or implanted with different concentrations or types of particles.

By utilizing particles embedded in the polymer 50, the electric field can be influenced in the manner desired. The electric field can be made to be more sensitive in some areas, and less sensitive in other areas. In those circuit areas where the electric field is to be minimized, then the overlying polymer area can be implanted with the type of particle that tends to cancel the electric field at that location. The electric field can, on the other hand, be made to accentuate the electric field in areas by embedding particles that achieve an enhancement of the electric field. In addition to the influence of the electric field, the particles can also function to getter deleterious ions, as noted above.

Figure 8:
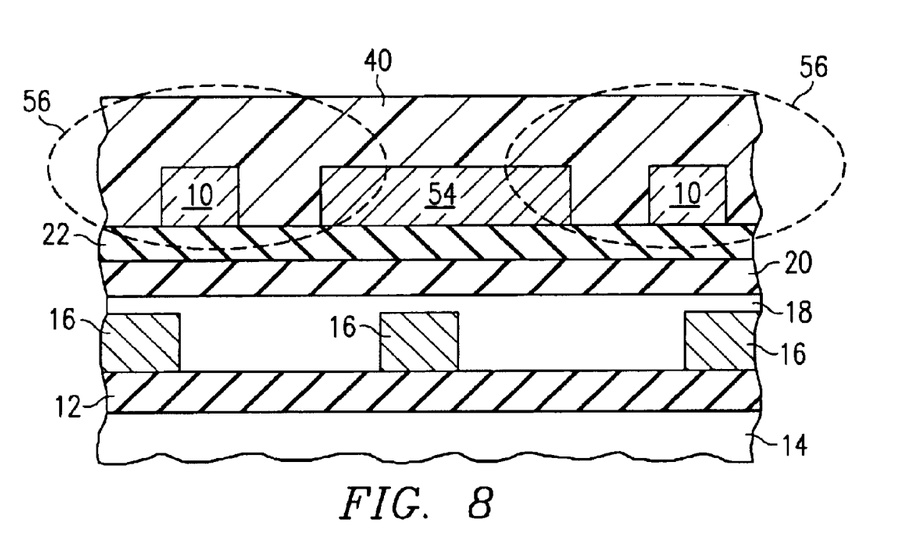
FIG. 8 illustrates a cross-sectional view similar to that of FIG. 5, but with an example of the shape of an electric field.
Figure 9:
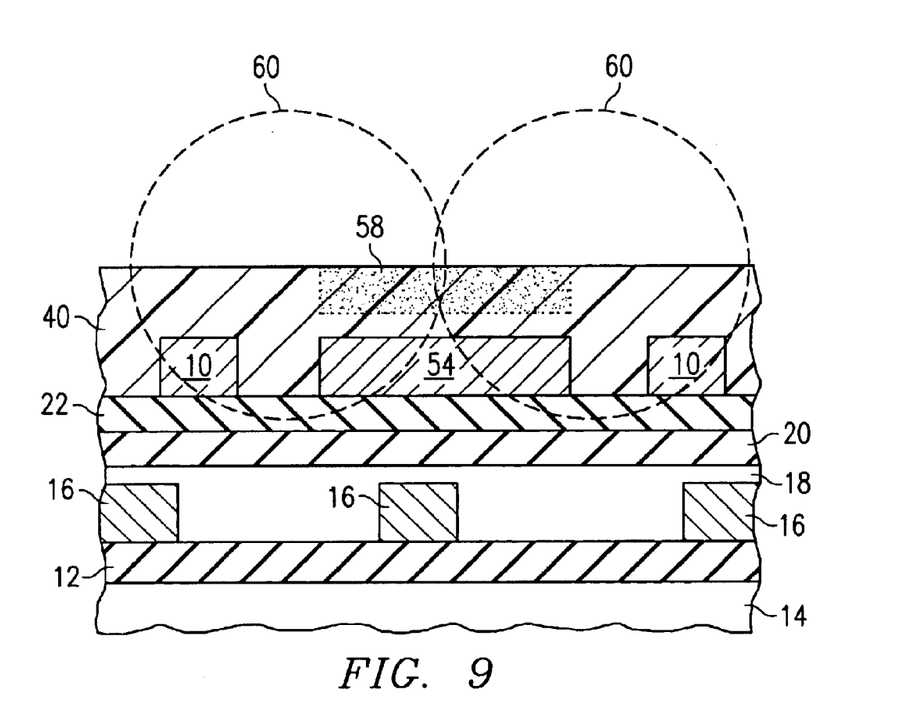
FIG. 9 illustrates the integrated circuit of FIG. 8 with particles embedded in the polymer layer, and the resultant shape of the electric field.

FIG. 8 illustrates a semiconductor structure much like that shown in FIG. 5, with an electric field 56 that may be characteristic of such a structure. It is realized that the shape of the electric field 56 is only representative, it being realized that the actual shape would be much more complex. In any event, the electric field 56 that exists between the object and the capacitor sensor circuits is of a specified shape, and affects the sensor circuits accordingly. When the polymer 40 is implanted with particles 58 as shown in FIG. 9, the electric field 60 is influenced such that the shape thereof is different from that shown in FIG. 8. When different areas in the polymer 40 have particles embedded therein, the interaction of the respective electric fields themselves will produce an effective field that is different from the individual fields. Those skilled in the art can determine by experimentation the areas of the wafer and particle dosages and types that are necessary to achieve the desired influence on the electric fields.

Figure 10A:
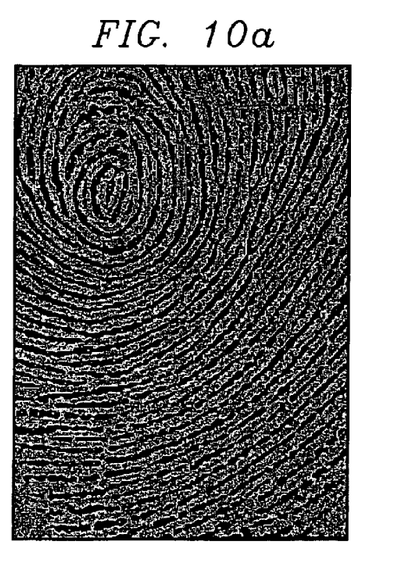
FIGS. 10a and 10b are enlarged photograph images that illustrate respectively the sensitivity of a moist and dry finger as applied to the physical interface of a touch-sensitive chip.
Figure 10B:
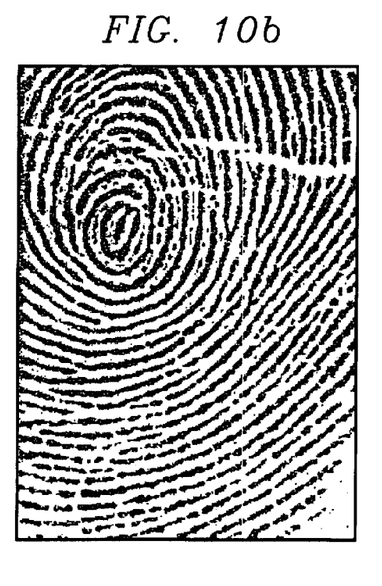

The quality of the image, in terms of contrast, of a touch-sensitive chip is proportional to the amount of moisture on the skin of the person's finger touching the physical interface. The higher the moisture content, the higher the image contrast between ridges and valleys. The image of a wet fingerprint is darker in contrast than a dry fingerprint. This is shown in FIGS. 10a and 10b, where the person's finger in FIG. 10a is moist and in FIG. 10b the person's finger is dry. Excessive moisture and/or oils can interfere with the imaging of a fingerprint, in that such liquids can pool in the valleys between the ridges of the fingerprint and degrade the contrast between unique features of the fingerprint. Excessive moisture and/or oils on a person's finger can also leave a residue on the physical interface that contributes to ghosting during the imaging process. It can be seen that the moisture level of skin can thus be correlated with the level of contrast of the image. An algorithm can be developed that could thus measure the skin moisture content. It may also look at other areas of skin, other than the fingertip, to determine if there is more sensitivity on the palm, nose, or arm etc. It may then be useful to diagnose moisture levels for hand treatment. And, if sufficiently sensitive, the system could measure such things as dehydration levels for medical diagnosis, or diagnose other dermatological problems.

Fingerprint readers in general, and the touch-sensitive chips in particular, have problems converting very moist fingers to corresponding images. The problem is that moisture from the finger directly overdrives the image, making it easier to leave a latent print. A "latent print" is a residual of the image after the finger is removed form the physical interface 30. The sensitivity of the latent fingerprint is a function of the material and surface states remaining on the interface surface of the sensor.

Many touch-sensitive chips exhibit a hypersensitivity to residue, such as soap and hand lotion, that remains on the surface of the physical interface after the person's finger is removed therefrom. Sensors in general can become overly sensitive to residual moisture and oils. In extreme cases of hypersensitivity, the circuits are unable to capture a usable image.

Figure 11A:
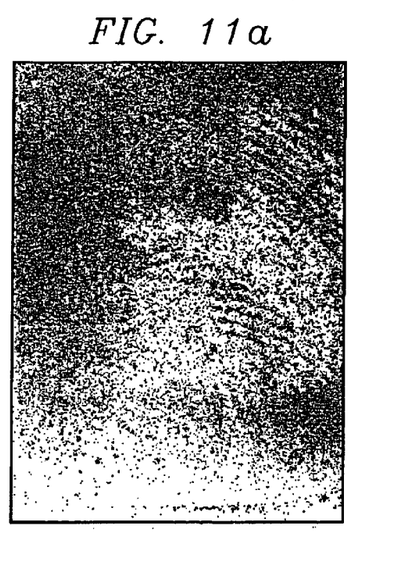
FIGS. 11a and 11b are enlarged photograph images that illustrate respectively the latency of a fingerprint on a prior art physical interface, and a physical interface that is constructed using fluorocarbon polymer.

In practice, it has been found that the use of a fluorocarbon polymer physical interface does not exhibit this hypersensitivity. An example can be seen in FIGS. 11a and 11b. FIG. 11a illustrates experimented results showing the latency of a fingerprint on a physical interface constructed according to the prior art. Before any fingerprint was applied to the physical interface, the sensor circuits provided an image of a monotonic grey image. After a fingerprint was applied to the physical interface, and removed, the residual fingerprint that was effectively sensed was that shown in FIG. 11a.

Figure 11B:
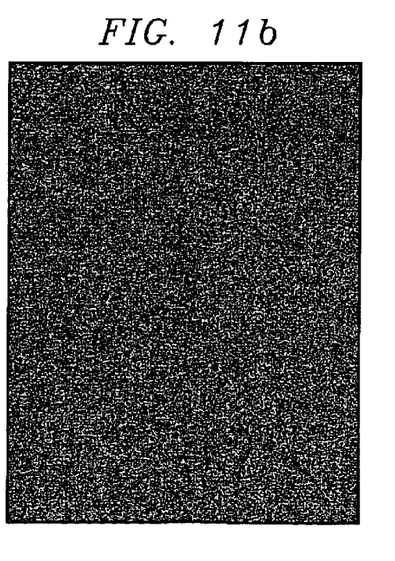

In contrast, when the physical interface is constructed with a fluorocarbon polymer, the background of the "image" sensed by the sensor circuits, after touching by a person's finger, was characterized as random species as shown in FIG. 11b. No residual print was sensed. This feature of the invention facilitates the high resolution imaging of objects applied to the physical interface.

It is believed that the substantial reduction in latency of fingerprints on the fluorocarbon polymer is related to its hydrophobic and oleophobic characteristics. It is known that the presence of polarized liquids, such as moisture, skin oils, hand lotion, etc., can fill the valleys between the ridges of fingerprint. Hydrophobic and oleophobic surfaces, such as the surface of a fluorocarbon polymer, facilitate the dispersion of such liquids from the valleys and thereby reduce or eliminate the adverse latency effects. The surface of the fluorocarbon polymer aids in the removal of the moisture between the ridges of the fingerprint by way of capillary action. The problem of "wet finger" is thus reduced substantially.

In any of the embodiments described above, those skilled in the art may use various means to protect the touch-sensitive chip against damage or destruction by electrostatic discharge currents and voltages. Various metal ESD grids and patterns can be formed around the periphery of the sensor capacitor matrix, and connected to ground. With this arrangement, static electric discharges from objects to the ESD grid will be carried to ground rather than through the capacitive sensing circuits.

Disclosed herein are a number of embodiments of the invention where a fluorocarbon polymer can be employed with integrated circuits to provide a robust physical interface thereto. The polymer can be used in addition to conventional passivation layers, or in replacement thereof. Moreover, the polymer can have particles embedded therein over the entire area, or in selected areas to provide a getter agent for deleterious ions, or to influence the electric field, or both.

Although the preferred and other embodiments have been described in detail, it should be understood that various changes, substitutions and alterations can be made therein without departing from the spirit and scope of the invention, as defined by the appended claims.

What is claimed is:

1. A method of manufacturing a semiconductor device, comprising:

providing a semiconductor substrate;

forming layers above the substrate including a layer of conductors;

forming a planarized fluorocarbon polymer layer above the conductors; and selectively implanting charged particles in the polymer layer in a localized pattern aligned above at least some of the conductors that define a corresponding underlying pattern, the particles remaining localized at the completion of the method of manufacture, whereby the localized pattern of particles influences an electric field existing in the polymer layer during operation of the device.

2. The method of claim 1 wherein the fluorocarbon polymer layer has an upper surface that defines an exterior surface of the device at the completion of the method of manufacturer, whereby the exterior surface is exposed to the environment during use of the device.

3. The method of claim 2 wherein the underlying pattern of conductors defines capacitor plates and the fluorocarbon polymer layer forms a dielectric for capacitors formed by the plates, the charged particles affecting the capacitance values of the capacitors.

4. The method of claim 2 wherein the fluorocarbon polymer layer predominantly comprises an amorphous fluoropolymer.

* * * * *